United States Patent [19]

Komatsu et al.

[11] Patent Number: 5,754,067
[45] Date of Patent: May 19, 1998

[54] FREQUENCY DIVIDER WITH SHIFT REGISTER AND MODULATOR

[75] Inventors: Yasuaki Komatsu; Yoshiyuki Yanagimoto, both of Hyogo, Japan

[73] Assignee: Hewlett-Packard Company, Palo Alto, Calif.

[21] Appl. No.: 649,400

[22] Filed: May 17, 1996

[30] Foreign Application Priority Data

May 24, 1995 [JP] Japan ..................................... 7-149661

[51] Int. Cl.$^6$ .................................................. H03K 19/094
[52] U.S. Cl. .................................. 327/115; 327/117
[58] Field of Search ..................................... 327/115, 117

[56] References Cited

U.S. PATENT DOCUMENTS 4,333,374  6/1982  Okumura et al. ......................... 327/115
5,038,117  8/1991  Miller ......................................... 332/16

*Primary Examiner*—Margaret Rose Wambach

[57] ABSTRACT

A non-integer frequency divider is provided that can perform switching of a frequency division ratio setting at high speed in order to improve the phase noise of frequency synthesizers and raise their response speeds. The frequency divider is a non-integer frequency divider that performs frequency division with frequency division ratios that contain decimal fraction, and includes a first frequency divider which can be set to a number of integer frequency division ratios; a second frequency divider (i.e., a shift register); a bit selector; a CA value generator; and a $\Sigma\Delta$ modulator. Non-integer frequency division is realized by switching the settings of the frequency division ratio and the period number of the frequency division output signal of the first frequency divider and the setting of the frequency division ratio of the second frequency divider. In the prior art, a programmable counter was used as the second frequency divider, but since the speed with which it switched settings was slow, it was not possible to satisfy the demands of frequency synthesizers. The use of a shift register for the second frequency divider enables both speed and noise improvements.

3 Claims, 4 Drawing Sheets

FREQUENCY DIVIDER WITH SHIFT REGISTER AND MODULATOR

FIELD OF THE INVENTION

This invention relates to a frequency divider in a phase locked loop and, more specifically, it concerns a frequency divider which is used in frequency synthesizers with high frequency resolution.

BACKGROUND OF THE ART

Frequency synthesizers are devices that generate arbitrary frequencies with high resolution and high accuracy. For example, frequency synthesizers with extremely high frequency resolution, such as 1 mHz, are embodied in the form of phase locked loops, using frequency dividers that can perform frequency division using rational values (below, referred to as "rational frequency dividers").

These rational frequency dividers obtain a rational frequency division ratio by switching the frequency division ratio of an integer frequency division ratio and averaging the values. FIG. 5 shows a diagram that is helpful in explaining the principle of a frequency synthesizer of the phase locked loop type. The oscillation frequency $f_{OUT}$ of a voltage-controlled oscillator 33 is divided by N with a programmable frequency divider 34 and the output is sent to one input of a phase comparator 31. A reference signal, $f_{REF}$, is input to the other input of phase comparator 31. The direct-current component of the output of phase comparator 31 has a magnitude that is proportional to the phase difference between the two input signals.

The signal output from phase comparator 31 controls the oscillation frequency $f_{OUT}$ of voltage-controlled oscillator 33, via a low-pass filter 32. As a result, the phase locked loop is operated so that the signal divided by frequency divider 34 agrees in phase with the frequency of the reference signal. Therefore, the output frequency $f_{OUT}$ of the voltage-controlled oscillator is given by the following formula:

$$f_{OUT} = N f_{REF} \quad (1)$$

Formula (1) shows that if N is an integer, a frequency can be produced with the resolution $f_{REF}$. In order to get the finer frequency resolution, methods of reducing $f_{REF}$ and increasing N have been considered. However, in order to lower the frequency $f_{REF}$ of the reference signal, it is necessary to reduce the bandwidth of the phase locked loop. As a result, increased phase noise and slower response times occur. Moreover, it is not practicable at present to generate reference frequencies such as 1 mHz.

In order to get the finer frequency resolution, a method of making the frequency division ratio into a rational number has been used. As mentioned above, the fundamental method obtains a rational frequency division ratio by switching the frequency division ratio of an integer frequency divider and averaging the values.

A simple example will be hereafter considered. Here, N represents an integer; "0.1" represents the decimal point and a decimal fraction "1"; and the frequency is divided by the frequency division ratio N.1. First, the frequency is divided by the frequency division ratio N, and 9 periods are output; next, the frequency is divided by N+1, and 1 period is output. As a result, the mean frequency division ratio becomes $$[9N + (N+1)]/10 = N.1 \quad (2)$$

and the desired rational frequency division ratio is obtained.

Various methods for obtaining rational frequency division ratios by switching several integer frequency division ratios and averaging them are disclosed in the prior art. Among these, a method using a $\Sigma\Delta$ modulator technology, shown in U.S. Pat. No. 5,038,117, is excellent from the point of view of phase noise, spurious levels, response speed, etc. Some frequency synthesizers employ rational frequency dividers that operate on a combination of the principal taught by the '117 patent, combined with an integer frequency divider which can set a number of frequency division ratios.

The '117 patent provides an algorithm wherein the number of divisions per period of the signal that is output by the integral frequency divider is determined so as to minimize the phase noise. It is difficult to realize an integer frequency divider to which the various frequency division ratios determined by this algorithm can be directly set with a single frequency divider. Ordinarily, therefore, a method is used in which a frequency divider that can be set to two or four frequency division ratios is combined with a programmable counter, which can set a frequency division ratio under program control, and the desired frequency division ratio is obtained by controlling the overall frequency division ratio.

As an example of this method, FIG. 6 shows an integer frequency divider that uses a first frequency divider 2 that can be set to two frequency division ratios. The input terminal of first frequency divider 2 is 1 and the output terminal is 5. A second frequency divider 4B is a programmable counter. A signal, which has been divided by first frequency divider 2, is output via line 3 to programmable counter 4B. The two integer frequency division ratios of first frequency divider 2 are P and P+1. This frequency division ratio is set selectively by control signals from a control line 6. The signal, divided by first frequency divider 2 is divided by C with programmable counter 4B and is output to frequency divider output terminal 5. The frequency division ratio C is set by C value setting line 7. The setting of the value of C will be discussed below.

Programmable counter 4B counts the output signal of first frequency divider 2 and sends this value to a bit comparator 13B through D data line 8.

Bit comparator 13B outputs to a frequency division ratio control line 6, a control signal by which the frequency division ratio of first frequency divider 2 is selectively set to either P or P+1. Bit comparator 13B compares the period number of the frequency divider output signal that has been input from D data line 8 with the value A that has been input from A value setting line 12. It outputs a control signal to first frequency divider 2 through frequency division ratio control line 6. This signal sets the frequency division ratio of first frequency divider 2 to P+1 when the frequency of the output signal of first frequency divider 2 is A or below, and switches the frequency division ratio to P when this frequency is greater than A. The setting of the value of A will be discussed below.

After first frequency divider 2 has performed the division at frequency division ratio P+1, under control of bit comparator 13B, and has output the A period, it switches to the frequency division ratio P. When the division of the frequency division ratio P outputs the C−A period, the input of programmable counter 4B becomes the total C period, and one period signal is output to frequency divider output terminal 5. The total frequency division number M of this one period is as follows:

$$M = A(P+1) + (C-A)P = C \times P + A \quad (3)$$

where C is greater than or equal to A, and P>A.

Formula (3) shows that any desired M can be set, when M is greater than or equal to P(P−1), by selecting suitable values of C and A. This example is an example of a first frequency divider (as described above) provided with two integer frequency division ratios, but it is possible to make the lower limit of the range in which any desired M can be set smaller than that mentioned above by increasing the variation of the frequency division ratio. If a high-speed first frequency divider and a programmable counter are combined in this manner, and C and A are suitably set, a frequency divider can be obtained wherein any desired integer frequency division can be set. Using this kind of frequency divider, a rational frequency divider can be realized by switching the frequency division ratio, as shown in the example discussed above.

Next, a means for generating frequency division coefficients for setting the values of C and A will be discussed. Such means has the essential structure of the $\Sigma\Delta$ modulator 10 and the CA value generator 11 shown in FIG. 6. $\Sigma\Delta$ modulator 10 is also called a $\Sigma\Delta$ modulator. $\Sigma\Delta$ modulator 10, based on the principle shown in the aforementioned U.S. Pat. No. 5,038,117, continues the determination of the number M for the next frequency division at each period of the signal of the frequency divider output terminal 5, based on the rational number N.F which was input from terminal 9. CA value generator 11 calculates C and A for each period, with respect to the value of M (which is renewed for each period). Since this calculation is simple, CA value generator 11 does not limit the operating speed of switching of the frequency division ratio setting.

Since there is a requirement in frequency synthesizers for a decrease in phase noise and increase in response speed, it is desirable to raise the reference frequency. For this purpose, it is necessary to switch, at high speed, the frequency division ratio, i.e., the switching of P and C. Therefore, we shall discuss CA value generator 11, bit comparator 13B, and the programmable counter 4B, which control the switching of the frequency division ratio.

CA value generator 11 calculates the values of C and A with respect to the value of M, once in each period of the signal from frequency divider terminal 5, as discussed above. Since this calculation is simple, CA value generator 11 does not limit the operating speed of the switching of the frequency division ratio.

Bit comparator 13B comprises simple combinatory logic; and since its delay time can be made short, it does not limit the operating speed of the switching of the frequency division ratio setting.

If programmable counter 4B does not switch to a next frequency division ratio C at high speed, compared to the former frequency division output signal, after a one period signal is output to frequency divider output terminal 5, a calculation error is produced. On the other hand, the programmable counter exhibits a comparatively large delay through combinatory logic circuits between its internal flip-flops. This limits its highest operating frequency. Therefore, programmable counter 4B limits the operating speed of the switching of the frequency division ratio setting. That is, the limited operating speed of the programmable counter prevents the increase of the reference frequency.

An object of this invention is to provide a rational frequency divider that can perform a high speed switching of a frequency division ratio in order to shorten the response speed, and reduce the phase noise of a frequency synthesizer.

SUMMARY OF THE INVENTION

Since it was found that in the prior art that the programmable counter was a hindrance to high-speed operation, the programmable counter is replaced by a shift register that can operate at high speeds. Moreover, with the change to the shift register, the bit comparator is replaced by a bit selector.

EXPLANATION OF SYMBOLS

Figure 1:
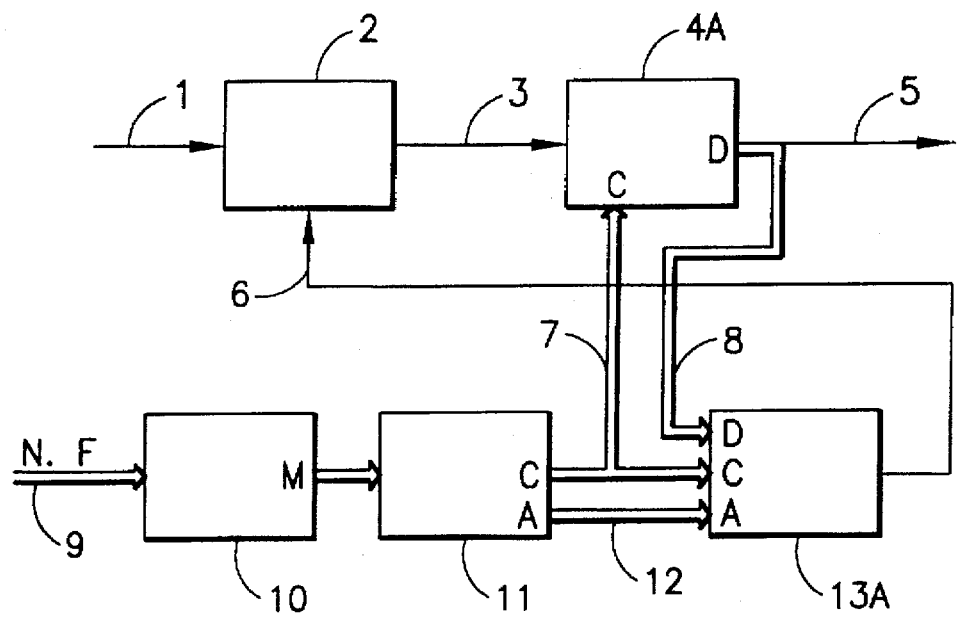
FIG. 1 shows the basic structure of an actual example of this invention.

1: Frequency divider input terminal
2: first frequency divider
3: first frequency divider output
4A: Shift register
4B: Programmable counter
5: Frequency divider output terminal
6: frequency division ratio control line
7: C value setting line
8: D data line
9: Terminal
10: $\Sigma\Delta$ modulator
11: CA value generator
12: A value setting line
13A: Bit selector
13B: Bit comparator
16: DIN terminal (data input terminal)
17: DOUT terminal (data output terminal)
18: _LOAD terminal
19: SER terminal
20: CLK terminal
21: _RESET terminal
22: Inverter
23: Gate circuit
24: Flip-flop
25: Gate circuit
26: Flip-flop
27: Gate circuit
28: Flip-flop
29: Gate circuit
30: Flip-flop
31: Phase comparator
32: Low-pass filter
33: Voltage-controlled oscillator
34: Programmable frequency divider

DETAILED DESCRIPTION OF THE INVENTION

As mentioned above, the reason why programmable counter 4B limits the speed of switching of the frequency division ratio is that there is a large delay in the combinatory logic circuits between its internal flip-flops. This invention uses a shift register, which has simple combinatory logic circuits between its internal flip-flops, and has a short delay time; it also uses a bit selector for the first frequency division ratio switching means referred to above, to conform with the operation of the shift register.

An example of this invention is shown in FIG. 1. The elements of the invention with the same functions as in the prior art circuit are given the same symbols.

Figure 2:
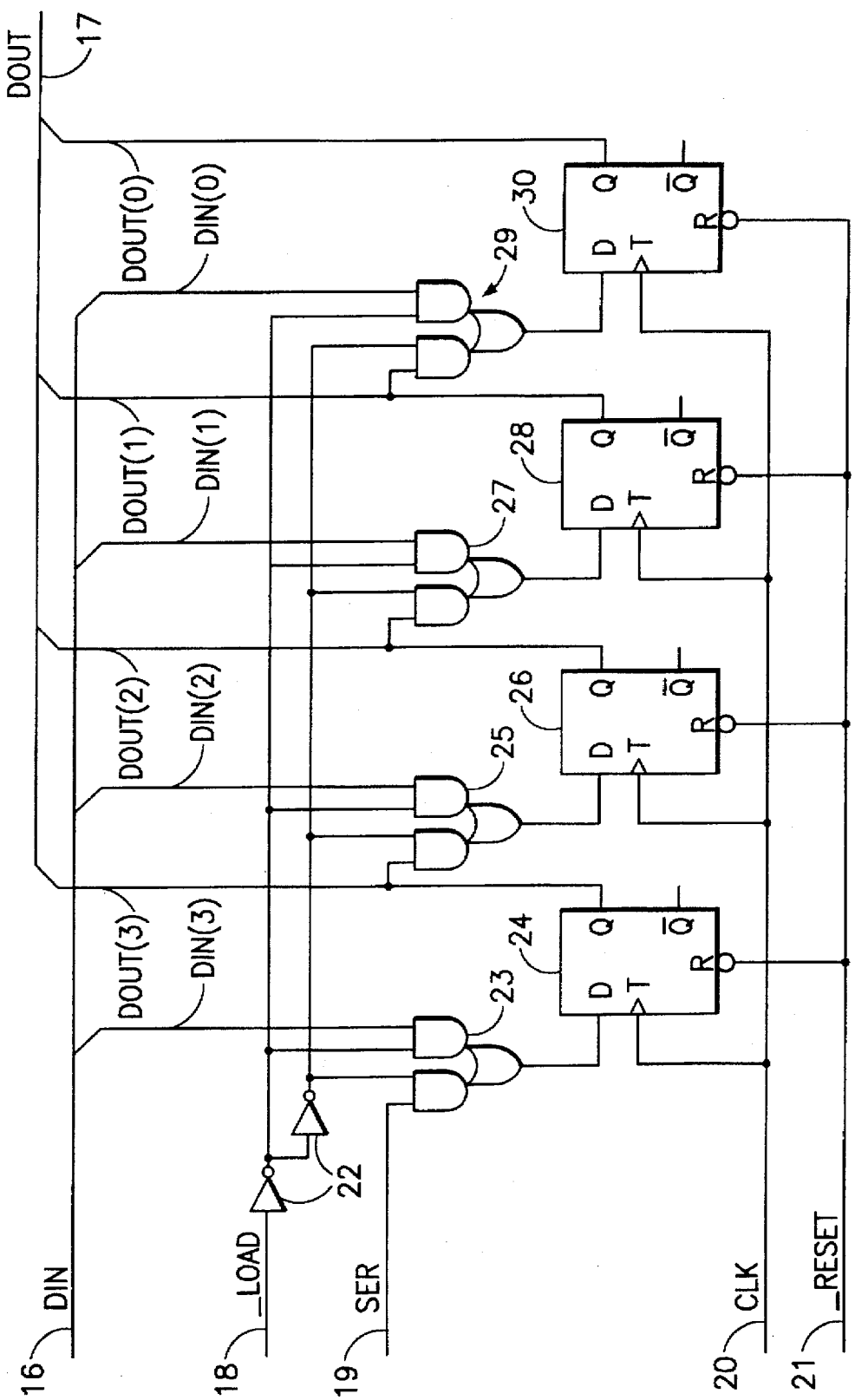
FIG. 2 shows an example of a shift register used in this invention.

In place of programmable counter 4B, a shift register 4A performs a C frequency division and also outputs a period number of the first frequency divider's output signal. An example of the shift register is shown in FIG. 2. FIG. 2 shows a 4-bit parallel data input shift register, the essential constituent elements of which are four flip-flops 24, 26, 28, and 30, gate circuits 23, 25, 27, and 29, and an inverter 22. Furthermore, if a large number of bits are needed, these shift registers may be connected in series. When they are connected in series, the DOUT (0) output is connected to the SER terminal 19 of the next stage.

The operation of the shift register is as follows. In FIG. 2, when _RESET terminal 21 is LOW, all of flip-flops 24, 26, 28, and 30 are reset to 0. Here, "_" indicates that the logic is negative. When _LOAD terminal 18 is LOW, DIN (3)–DIN (0) on the data input terminal 16 are loaded in flip-flops 24, 26, 28, and 30 at the rise of the synchronization signal (which is input to CLK terminal 20). The result of this action is output to data output terminal 17 as the data DOUT (3) to DOUT (0).

When _LOAD terminal 18 is HIGH, the state of each flip-flop shifts to the flip-flop on the right, at each rise of the synchronization signal on CLK terminal 20. That is, the data DOUT (0) is set to the SER terminal 19 of the next stage of the shift register. The data DOUT (1) thus shifts to DOUT (0), the data DOUT (2) shifts to DOUT (1), and the data DOUT (3) shifts to DOUT (2); and the input data of SER terminal 19 becomes DOUT (3).

As shown in FIG. 2, there are only logic circuits 23, 25, 27, and 29, equivalent to two gates of delay, between the flip-flops of the register; therefore, the delay time of this logical circuit is small, and it can operate at an extremely high speed. Moreover, even if the number of bits is increased, the size of the logical circuits between the flip-flops is not changed, and the delay time is not increased.

In order to use this shift register as the second frequency division means, the following connections are made. DIN terminal (data input terminal) 16 is connected to the C value data line 7. The DOUT terminal (data output terminal) is connected to the bit selector 13A through D data line 8. At the same time, the DOUT outputs the C-divided signal to the frequency divider output terminal 5.

The output of the last-stage flip-flop of the series-connected shift registers is connected to frequency divider output terminal 5 as the C-divided signal, and it is connected to the _LOAD terminal of each stage of the shift register. As a result, when the output of the flip-flop of the last stage becomes 0, the C value is loaded in the shift register at the next rise of the CLK.

SER terminal 19 is connected to the output of the last-stage flip-flop of the shift register of the previous stage of the series. The signal line is not connected to SER terminal 19 of the first stage. CLK terminal 20 is connected to first frequency divider output 3. That is, the data in the shift register are shifted in synchronism with the signal that was frequency-divided by the first frequency division means.

When a K-bit shift register is formed by series connections and the number of bits of the D data line is made K, K–1, ..., 1, beginning from the first stage; DOUT is shown as D(K). Bit number 1 is the last-stage data line; as mentioned above, it is connected to the output terminal and the _LOAD terminals of each shift register.

In the case of the programmable counter used in the prior art, the input counter value D was a value which could be expressed in binary digits on the output data line. Therefore, by using bit comparator 13B, which compared the bits of the data lines, it determined that the first frequency divider output reached period A, and thus controlled the first frequency divider. With the shift register implementation, however, the period number of the first frequency division output is determined from the waveform on the D data line. Therefore, with the shift register, the fact that the first frequency divider output reaches period A is judged by selecting specific bits.

Figure 3:
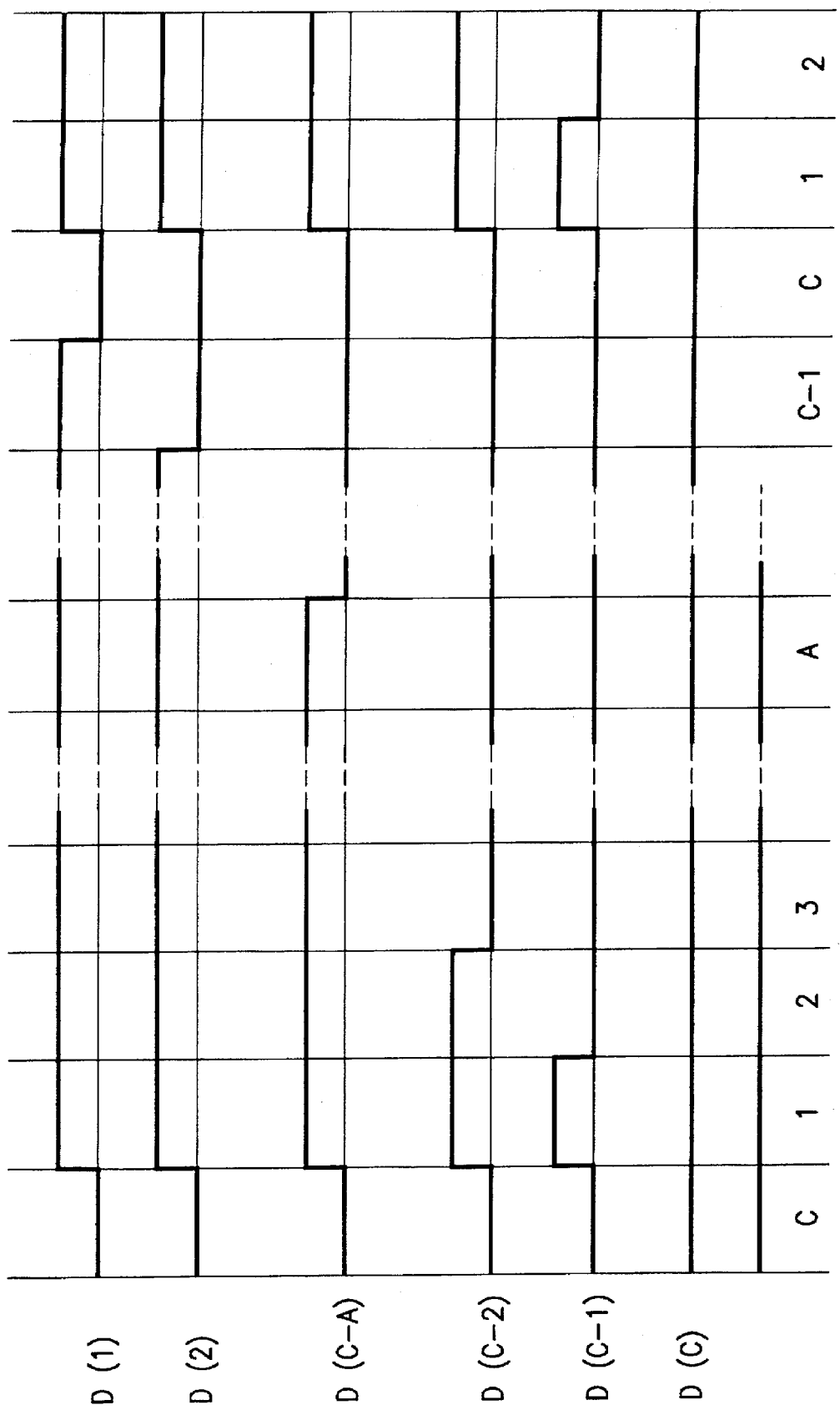
FIG. 3 shows an example of output signals of the shift register used in this invention.
Figure 5:
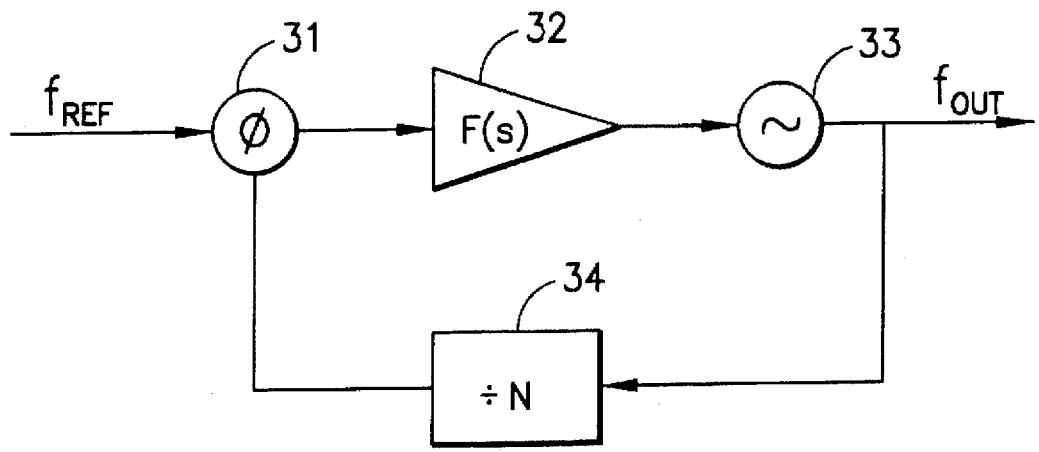
FIG. 5 shows the principle of a frequency synthesizer of the phase locked loop type.
Figure 6:
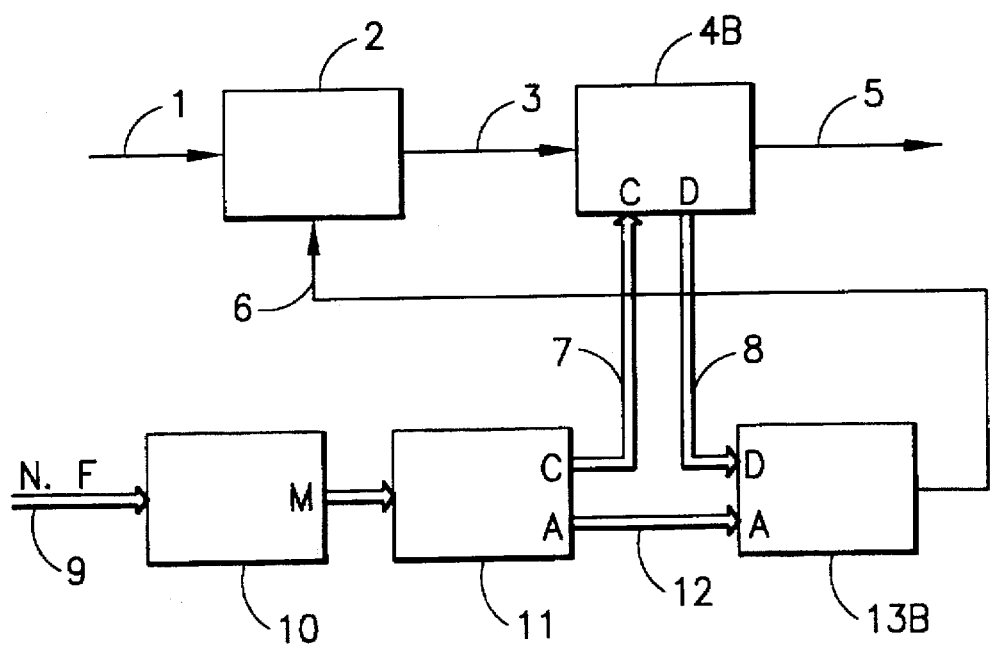
FIG. 6 shows an example of a prior art frequency divider.

FIG. 3 shows an example of the output waveform on the D data lines of shift register 4A. An example is shown in which 0 is loaded into the bits larger than the (C–1)th bit of the shift register, and 1 is loaded into the bits numbered C–1 and lower (the D at the upper side of the figure). Other bit pattern combinations are also possible. In FIG. 3, the 0 loaded in the Cth bit shifts successively from the (C–1)th bit to the first bit, with each increment of the input. Since the increment value immediately before D (C–A) changes from 1 to 0 expresses A, the switching of the setting of the frequency division ratio of the first frequency divider can be controlled by this waveform.

When the count value becomes C, D(1) becomes 0. When D(1) changes to 0, the new data are loaded at the next rise of CLK, the count value returns to 1, and the count is started over. Furthermore, when C is smaller than the maximum bit number K of the shift register, the bits of D (C) and above become 0; therefore, there is no change in the operation described above.

Figure 4:
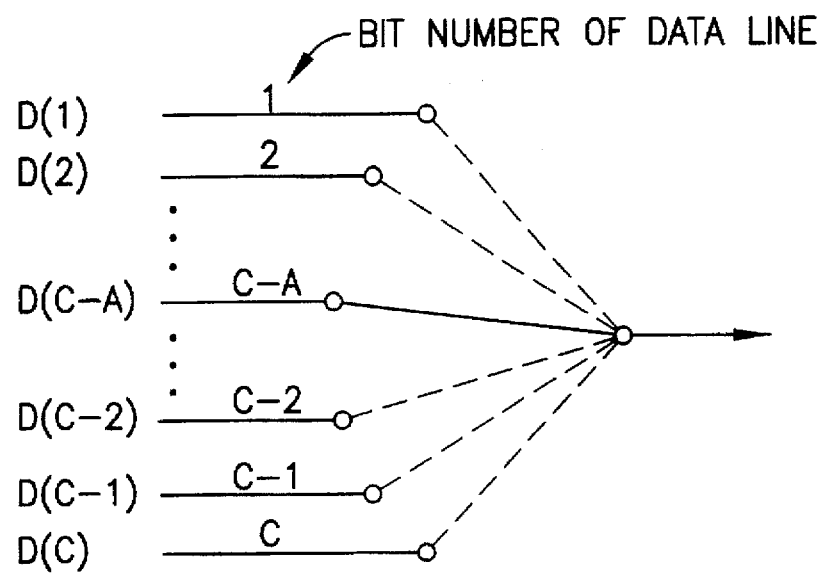
FIG. 4 shows the concept of a bit selector of this invention.

FIG. 4 shows a conceptual diagram of bit selector 13A, which selects the bits of D(C–A). In FIG. 4, following the C and A values determined by CA value generator 11, the (C–A)th signal line is selected from the shift register output data lines and the first frequency divider control signal is output. As a result, the first frequency divider is controlled so that it divides the frequency with the frequency division ratio P+1 until the count value becomes A, and divides the frequency with the frequency division ratio P beginning with the count value A+1.

This selection circuit can be realized with simple combinatory logic. Moreover, it is possible to shorten the delay time.

The case in which a frequency divider that can be set to two frequency division ratios has been shown above, but this invention is also applicable when frequency dividers are used that can be set to more than two frequency division ratios. For example, if a frequency divider is used that can be set to four frequency division ratios, the function of calculating B, besides A, is added to the CA value generator 11. Moreover, a control line may be added, which controls the first frequency divider on the basis of the value of B, calculated by adding a bit selector.

In summary, a shift register is used in place of a programmable counter, which has a slow operating speed. This makes possible the rapid switching of a frequency division ratio selection. As a result, high-speed rational frequency division becomes possible. In frequency synthesizers, the frequency of the reference signal can be raised, the phase noise can be reduced, and the response speed can be increased. As an example, the maximum reference frequency of the prior art was 2 MHz, but this can be raised to 10 MHz by means of this invention. By doing so, the phase noise of the frequency synthesizer can be improved by 10 dB or more, and the response speed can be improved by a factor of two or more.

We claim:

1. A frequency divider that performs frequency division at non-integer frequency division ratios, comprising:

frequency division means for receiving an input frequency and including a first frequency division means that can be set at a number of integer frequency division ratios and a second frequency division means coupled to said first frequency division means and including shift register means for performing frequency division of the output signal of the first frequency division means;

frequency division coefficient generating means for determining a period number of an output signal which is output from the first frequency division means during a first frequency division ratio used by the first frequency division means and for determining a frequency division ratio of the second frequency division means;

frequency division ratio switching means, for selectively switching a frequency division ratio of the first frequency division means by comparing a selected bit output from the shift register means with a predetermined logic level;

means for setting a frequency division ratio of the second frequency division means to a value determined by the frequency division coefficient generating means; and a bit selection means included in the frequency division ratio switching means for selecting the bit output from bit outputs of the shift register means indicating the period number determined by the frequency division coefficient generating means.

2. A frequency divider in accordance with claim 1, wherein the frequency division coefficient generating means includes a $\Sigma\Delta$ modulator.

3. A frequency synthesizer, comprising a frequency divider as described in claim 1.

* * * * *